(12) United States Patent
Jung

(10) Patent No.: US 12,425,028 B2
(45) Date of Patent: Sep. 23, 2025

(54) SEMICONDUCTOR DEVICE

(71) Applicant: SK hynix Inc., Gyeonggi-do (KR)

(72) Inventor: Tae Kyoung Jung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 186 days.

(21) Appl. No.: 18/188,478

(22) Filed: Mar. 23, 2023

(65) Prior Publication Data

US 2024/0080026 A1 Mar. 7, 2024

(30) Foreign Application Priority Data

Sep. 7, 2022 (KR) ........................ 10-2022-0113191

(51) Int. Cl.
| | | |
|---|---|---|
| H03K 19/00 | (2006.01) | |
| H03K 3/037 | (2006.01) | |
| H03K 19/003 | (2006.01) | |

(52) U.S. Cl.
CPC ....... H03K 19/0016 (2013.01); H03K 3/0372 (2013.01); H03K 19/0013 (2013.01); H03K 19/00315 (2013.01)

(58) Field of Classification Search
CPC .......... H03K 19/003; H03K 19/00315; H03K 19/01; H03K 19/017; H03K 19/017509; H03K 19/01721; H03K 19/0175; H03K 19/0185; H03K 19/018521
See application file for complete search history.

(56) References Cited

U.S. PATENT DOCUMENTS

| | | | | |
|---|---|---|---|---|
| 5,852,540 | A | * 12/1998 | Haider | .................. H02H 9/046 361/111 |
| 6,057,717 | A | * 5/2000 | Kawano | ........... H03K 19/00315 327/434 |
| 2005/0236703 | A1 | 10/2005 | Kazi et al. | |
| 2006/0220705 | A1* | 10/2006 | Shau | .............. H03K 19/018521 327/112 |
| 2008/0129348 | A1* | 6/2008 | Shau | ................ H03K 19/09485 327/108 |
| 2010/0097117 | A1 | 4/2010 | Wang et al. | |
| 2011/0133773 | A1* | 6/2011 | Shau | .................... H04L 25/0278 326/87 |
| 2015/0061734 | A1* | 3/2015 | Ogawa | ........... H03K 19/018521 327/143 |
| 2020/0228103 | A1* | 7/2020 | Geng | ............... H03K 3/356113 |
| 2020/0244266 | A1* | 7/2020 | Lee | .................. H03K 19/17788 |
| 2021/0367586 | A1* | 11/2021 | Kim | ................ H03K 19/00315 |
| 2024/0080026 | A1* | 3/2024 | Jung | .................. H03K 19/0013 |

* cited by examiner

*Primary Examiner* — Jason M Crawford
(74) *Attorney, Agent, or Firm* — IP & T GROUP LLP

(57) ABSTRACT

Disclosed is a semiconductor device including a first pad, a pull-up resistor connected between the first pad and a supply terminal of a high voltage, a second pad connected to the first pad, a pull-down driver connected between the second pad and a supply terminal of a low voltage, and suitable for selectively driving the second pad with the low voltage based on a control signal corresponding to a predetermined signal, a first leakage prevention driver connected between an input terminal of the control signal and the supply terminal of the low voltage, and suitable for selectively driving the control signal with the low voltage based on a leakage prevention signal, and a controller connected to the second pad, and suitable for generating the leakage prevention signal based on a mode signal and a tie control signal.

7 Claims, 5 Drawing Sheets

SEMICONDUCTOR DEVICE

CROSS-REFERENCE TO RELATED APPLICATION(S)

This application claims priority under 35 U.S.C. § 119 to Korean Patent Application No. 10-2022-0113191, filed on Sep. 7, 2022, the disclosure of which is incorporated herein by reference in its entirety.

BACKGROUND

1. Field

Various embodiments of the present disclosure relate to a semiconductor design technique, and more particularly, to a semiconductor device including an interface.

2. Description of the Related Art

A semiconductor device includes a master chip and a slave chip. Each of the master chip and the slave chip includes an interface for inputting/outputting a signal.

One master chip is connected to at least one slave chip. As a signal line (or a pad) connected between a master chip and at least one slave chip is basically maintained at a logic high level by a pull-up resistor included in the master chip, and the logic level of the signal line is selectively changed to a logic low level by a driver included in the selected slave chip, communication is made between the master chip and the at least one slave chip. Even though one master chip is connected to a plurality of slave chips, a slave chip that substantially communicates with the master chip is the selected slave chip currently designated by the master chip. To this end, the master chip specifies an address of the selected slave chip to the plurality of slave chips before communicating with the selected slave chip.

SUMMARY

Various embodiments of the present disclosure are directed to a semiconductor device that controls a leakage current not to occur at an interface of a slave chip in a power-off mode of the slave chip.

In accordance with an embodiment of the present disclosure, a semiconductor device may include: a first pad; a pull-up resistor connected between the first pad and a supply terminal of a high voltage; a second pad connected to the first pad; a pull-down driver connected between the second pad and a supply terminal of a low voltage, and suitable for selectively driving the second pad with the low voltage based on a control signal corresponding to a predetermined signal; and a first leakage prevention driver connected between an input terminal of the control signal and the supply terminal of the low voltage, and suitable for selectively driving the control signal with the low voltage based on a leakage prevention signal.

In accordance with an embodiment of the present disclosure, a semiconductor device may include: a first pad; a pull-up resistor connected between the first pad and a supply terminal of a high voltage; a second pad connected to the first pad; a pull-down driver connected between the second pad and a supply terminal of a low voltage, and suitable for selectively driving the second pad with the low voltage based on a control signal corresponding to a predetermined signal; a first leakage prevention driver connected between an input terminal of the control signal and the supply terminal of the low voltage, and suitable for selectively driving the control signal with the low voltage based on a leakage prevention signal; and a controller connected to the second pad, and suitable for generating the leakage prevention signal based on a mode signal and a tie control signal.

In accordance with an embodiment of the present disclosure, a semiconductor device may include: a master chip suitable for maintaining a first pad at a first logic level corresponding to a high voltage; and at least one slave chip suitable for selectively changing a second pad, which is connected to the first pad, to a second logic level corresponding to a low voltage based on a control signal in a power-on mode of the at least one slave chip, and forcibly deactivating the control signal based on a leakage prevention signal in a power-off mode of the at least one slave chip.

In accordance with an embodiment of the present disclosure, a semiconductor device may include: a master chip suitable for maintaining a first pad at a first logic level corresponding to a high voltage; and at least one slave chip suitable for selectively changing a second pad, which is connected to the first pad, to a second logic level corresponding to a low voltage based on a mode signal and a control signal in a power-on mode of the at least one slave chip, and forcibly deactivating the control signal based on the mode signal and a tie control signal in a power-off mode of the at least one slave chip.

In accordance with an embodiment of the present disclosure, a semiconductor device may include: a pad; a first grounding circuit configured to ground the pad according to a logic level of a first control node; and a first control circuit configured to ground the first control node according to a logic level a second control node.

DETAILED DESCRIPTION

Various embodiments of the present disclosure are described below with reference to the accompanying drawings, in order to describe in detail the present disclosure so that those with ordinary skill in art to which the present disclosure pertains may easily carry out the technical spirit of the present disclosure.

It will be understood that when an element is referred to as being "connected to" or "coupled to" another element, the element may be directly connected to or coupled to the another element, or electrically connected to or coupled to the another element with one or more elements interposed therebetween. In addition, it will also be understood that the terms "comprises," "comprising," "includes," and "including" when used in this specification do not preclude the presence of one or more other elements, but may further include or have the one or more other elements, unless otherwise mentioned. In the description throughout the specification, some components are described in singular forms, but the present disclosure is not limited thereto, and it will be understood that the components may be formed in plural.

Figure 1:
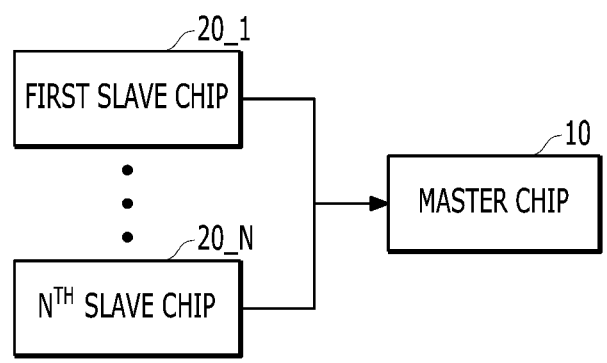
FIG. 1 is a block diagram illustrating a semiconductor device in accordance with an embodiment of the present disclosure.

FIG. 1 is a block diagram illustrating a semiconductor device in accordance with an embodiment of the present disclosure.

Referring to FIG. 1, the semiconductor device may include a master chip 10 and a plurality of slave chips 20_1 to 20_N.

The plurality of slave chips 20_1 to 20_N may share the master chip 10. For example, the plurality of slave chips 20_1 to 20_N may be connected in common to a master chip pad MDP (refer to FIG. 2), which is included in the master chip 10. Each of the plurality of slave chips 20_1 to 20_N may independently support a power-on mode and a power-off mode. Each of the plurality of slave chips 20_1 to 20_N may output a predetermined signal to the master chip 10 in the power-on mode. The predetermined signal may be one of a data signal, an address signal, a clock signal and various control signals.

Figure 2:
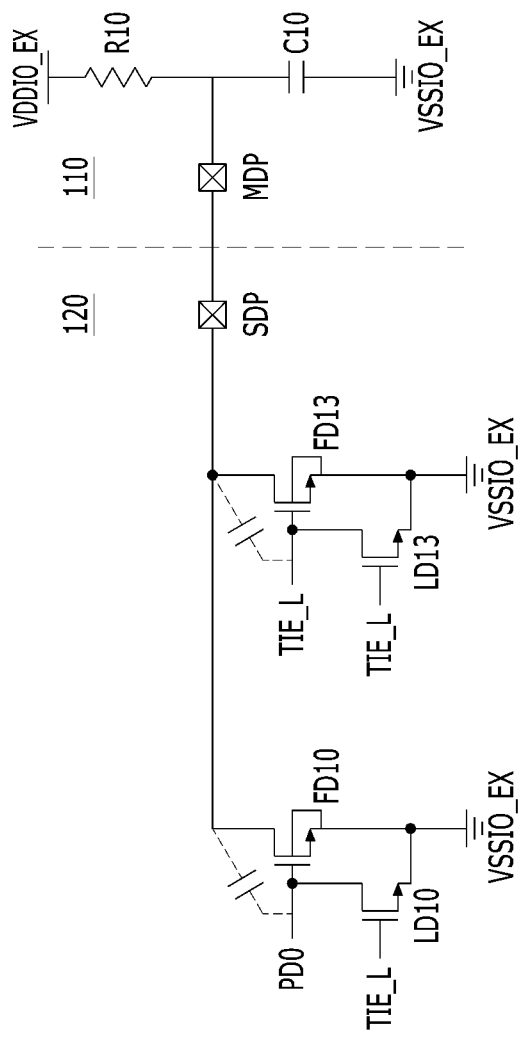
FIG. 2 is a circuit diagram illustrating an example of the semiconductor device illustrated in FIG. 1 in accordance with an embodiment of the present disclosure.

FIG. 2 is a circuit diagram illustrating an example of the semiconductor device illustrated in FIG. 1 in accordance with an embodiment of the present disclosure. For convenience in description, FIG. 2 representatively illustrates one of the plurality of slave chips 20_1 to 20_N.

Referring to FIG. 2, a master chip 110 may maintain the master chip pad MDP at a first logic level corresponding to a high voltage VDDIO_EX. The first logic level may be a logic high level, i.e., "1" of the predetermined signal generated through the master chip pad MDP. The master chip 110 may use dedicated power of the master chip 110. The dedicated power of the master chip 110 may refer to the high voltage VDDIO_EX or a low voltage VSSIO_EX that is continuously supplied regardless of the power mode (i.e., the power-on mode or the power-off mode) of a slave chip 120.

For example, the master chip 110 may include a pull-up resistor R10, a capacitor C10 and the master chip pad MDP.

The pull-up resistor R10 may be connected between a supply terminal of the high voltage VDDIO_EX and the master chip pad MDP.

The capacitor C10 may be connected between the master chip pad MDP and a supply terminal of the low voltage VSSIO_EX.

The master chip pad MDP may be maintained at the first logic level by the pull-up resistor R10, and the logic level of the master chip pad MDP may be changed, that is, switch or transition, from the first logic level to a second logic level depending on the slave chip 120. The second logic level may be a logic low level, i.e., "0" of the predetermined signal generated through the master chip pad MDP.

The slave chip 120 may selectively change the logic level of a slave chip pad SDP to the second logic level, which corresponds to the low voltage VSSIO_EX, on the basis of a control signal PD0 in the power-on mode, and may forcibly deactivate the control signal PD0 on the basis of a leakage prevention signal TIE_L in the power-off mode.

The control signal PD0 may have the logic low level or the logic high level in response to the predetermined signal in the power-on mode, and have a deactivation level in the power-off mode using a floating state. In the power-off mode, the control signal PD0 may unintentionally have an activation level, which corresponds to the logic high level, in the floating state. For example, the control signal PD0 may have the activation level according to a change in a voltage level of the master chip pad MDP by a parasitic capacitor formed between the slave chip pad SDP and an input terminal of the control signal PD0 in the power-off mode. In the power-off mode, when the control signal PD0 has the activation level, a leakage current may occur from the slave chip pad SDP to the supply terminal of the low voltage VSSIO_EX. However, the slave chip 120 may prevent the leakage current by forcibly deactivating the control signal PD0 when the control signal PD0 is unintentionally activated in the power-off mode. A case, that is, a condition, in which the control signal PD0 is unintentionally activated in the power-off mode may be as follows. When a signal is transmitted between another slave chip and the master chip 110, the voltage level of the master chip pad MDP may change from a low voltage level to a high voltage level. Alternatively, the voltage level of the master chip pad MDP may change to a relatively high voltage level due to an electric shock or stress.

The leakage prevention signal TIE_L may have the logic low level regardless of the predetermined signal in the power-on mode, and have the deactivation level in the power-off mode using a floating state. In the power-off mode, the leakage prevention signal TIE_L may unintentionally have an activation level, which corresponds to the logic high level, in a floating state. For example, the leakage prevention signal TIE_L may have the activation level according to a change in a voltage level of the master chip pad MDP by a parasitic capacitor formed between the slave chip pad SDP and an input terminal of the leakage prevention signal TIE_L in the power-off mode. In the power-off mode, when the leakage prevention signal TIE_L has the activation level, a leakage current may occur from the slave chip pad SDP to the supply terminal of the low voltage VSSIO_EX. However, the slave chip 120 may prevent the leakage current by forcibly deactivating the leakage prevention signal TIE_L when the leakage prevention signal TIE_L is unintentionally activated in the power-off mode. A case, that is, a condition, in which the leakage prevention signal TIE_L is unintentionally activated in the power-off mode may be as follows. When a signal is transmitted between another slave chip and the master chip 110, the voltage level of the master chip pad MDP may change from a low voltage level to a high voltage level. Alternatively, the voltage level of the master chip pad MDP may change to a relatively high voltage level due to an electric shock or stress.

The power-on mode may refer to a mode in which dedicated power of the slave chip 120 is supplied to the slave chip 120. Accordingly, in the power-on mode, signals (i.e., control signals), for example, PD0 and TIE_L, may be normally generated on the basis of the dedicated power of the slave chip 120 in the slave chip 120. The power-off mode may refer to a mode in which the dedicated power of the slave chip 120 is not supplied to the slave chip 120. Accordingly, in the power-off mode, the signals, for example, PD0 and TIE_L, may be in a floating state in the slave chip 120. However, according to an embodiment of the present disclosure, in the power-off mode, the signals, for example, PD0 and TIE_L, may forcibly have the deactivation levels even though the signals unintentionally have the activation levels.

For example, the slave chip 120 may include a pull-down driver (i.e., a first grounding circuit) FD10, a leak prevention driver (i.e., a first control circuit) LD10, a dummy driver (i.e., a second grounding circuit) FD13 and a dummy leak prevention driver (i.e., a second control circuit) LD13.

The pull-down driver FD10 may be connected between the slave chip pad SDP and the supply terminal of the low voltage VSSIO_EX. For example, the pull-down driver FD10 may include an NMOS transistor having a gate terminal receiving the control signal PD0 and a source terminal and a drain terminal connected between the slave chip pad SDP and the supply terminal of the low voltage VSSIO_EX.

The pull-down driver FD10 may selectively drive the slave chip pad SDP with the low voltage VSSIO_EX on the basis of the control signal PD0 corresponding to the predetermined signal in the power-on mode. When the predetermined signal has the logic low level, the pull-down driver FD10 may be enabled based on the control signal PD0 and drive the slave chip pad SDP with the low voltage VSSIO_EX. When the predetermined signal has the logic high level, the pull-down driver FD10 may be disabled based on the control signal PD0. The pull-down driver FD10 may be disabled based on the control signal PD0 having the logic low level by the leakage prevention driver LD10 in the power-off mode. That is, in the power-off mode, the pull-down driver FD10 may electrically cut off a path between the slave chip pad SDP and the supply terminal of the low voltage VSSIO_EX, thereby preventing a leakage current occurring from the slave chip pad SDP to the supply terminal of the low voltage VSSIO_EX.

The leakage prevention driver LD10 may be connected between the input terminal of the control signal PD0 and the supply terminal of the low voltage VSSIO_EX. For example, the leakage prevention driver LD10 may include an NMOS transistor having a gate terminal receiving the leakage prevention signal TIE_L and a source terminal and a drain terminal connected between the input terminal of the control signal PD0 and the supply terminal of the low voltage VSSIO_EX.

The leakage prevention driver LD10 may selectively drive the control signal PD0 with the low voltage VSSIO_EX on the basis of the leakage prevention signal TIE_L. For example, the leakage prevention driver LD10 may be disabled based on the leakage prevention signal TIE_L having the logic low level in the power-on mode, and drive the input terminal of the control signal PD0 with the low voltage VSSIO_EX on the basis of the leakage prevention signal TIE_L having the activation level in the power-off mode.

The dummy driver FD13 may be connected between the slave chip pad SDP and the supply terminal of the low voltage VSSIO_EX. For example, the dummy driver FD13 may include an NMOS transistor having a gate terminal receiving the leakage prevention signal TIE_L and a source terminal and a drain terminal connected between the slave chip pad SDP and the supply terminal of the low voltage VSSIO_EX.

The dummy driver FD13 may be disabled based on the leakage prevention signal TIE_L having the logic low level in the power-on mode and the power-off mode. In the power-on mode and the power-off mode, the dummy driver FD13 may electrically cut off a path between the slave chip pad SDP and the supply terminal of the low voltage VSSIO_EX, thereby having no effect on the slave chip pad SDP. Particularly, in the power-off mode, as described above, the leakage prevention signal TIE_L may be in a floating state, but may have the activation level according to a change in a voltage level of the master chip pad MDP by the parasitic capacitor formed between the slave chip pad SDP and the input terminal of the leakage prevention signal TIE_L. Accordingly, when the leakage prevention signal TIE_L has the activation level, the dummy leakage prevention driver LD13 may be disabled by converting the leakage prevention signal TIE_L having the activation level into the leakage prevention signal TIE_L having the deactivation level corresponding to the low voltage VSSIO_EX.

The dummy leakage prevention driver LD13 may be connected between the input terminal of the leakage prevention signal TIE_L and the supply terminal of the low voltage VSSIO_EX. For example, the dummy leakage prevention driver LD13 may include an NMOS transistor having a gate terminal receiving the leakage prevention signal TIE_L and a source terminal and a drain terminal connected between the input terminal of the leakage prevention signal TIE_L and the supply terminal of the low voltage VSSIO_EX.

The dummy leakage prevention driver LD13 may selectively drive the input terminal of the leakage prevention signal TIE_L with the low voltage VSSIO_EX on the basis of the leakage prevention signal TIE_L. For example, the dummy leakage prevention driver LD13 may be disabled based on the leakage prevention signal TIE_L having the logic low level in the power-on mode, and drive the input terminal of the control signal PD0 with the low voltage VSSIO_EX on the basis of the leakage prevention signal TIE_L having the activation level in the power-off mode.

The slave chip pad SDP may be connected to the master chip pad MDP. The slave chip pad SDP may output the predetermined signal having the logic low level or the logic high level according to the control signal PD0 in the power-on mode, and may be maintained at the logic high level by the master chip pad MDP in the power-off mode.

Hereinafter, an operation of the semiconductor device in accordance with a first embodiment of the present disclosure, which has the above-described configuration, is described.

First, the operation of the semiconductor device in the power-on mode is described.

The master chip 110 may receive the high voltage VDDIO_EX and the low voltage VSSIO_EX. Each of the high voltage VDDIO_EX and the low voltage VSSIO_EX may be dedicated power that is continuously supplied regardless of whether a power mode of the slave chip 120 is the power-on mode or the power-off mode. The master chip 110 may maintain the master chip pad MDP at the first logic level corresponding to the high voltage VDDIO_EX. For example, the first logic level may be a logic high level, i.e., "1", of the predetermined signal generated through the master chip pad MDP.

The slave chip 120 may selectively change the logic level of the slave chip pad SDP to the second logic level corresponding to the low voltage VSSIO_EX, on the basis of the control signal PD0 and the leakage prevention signal TIE_L. For example, the second logic level may be a logic low level, i.e., "0", which is an inversion level of the first logic level. When the predetermined signal corresponds to the logic low level, the slave chip 120 may drive the slave chip pad SDP with the low voltage VSSIO_EX. Conversely, when the predetermined signal corresponds to the logic high level, the slave chip 120 may not drive the slave chip pad SDP with the low voltage VSSIO_EX. The operation of the slave chip 120 in the power-on mode is described in more detail as follows.

The dummy driver FD13 may be disabled based on the leakage prevention signal TIE_L having the logic low level. The dummy driver FD13 may electrically cut off a path between the slave chip pad SDP and the supply terminal of the low voltage VSSIO_EX, thereby having no effect on the slave chip pad SDP.

Each of the leakage prevention driver LD10 and the dummy leakage prevention driver LD13 may be disabled based on the leakage prevention signal TIE_L having the logic low level.

The pull-down driver FD10 may selectively drive the slave chip pad SDP with the low voltage VSSIO_EX on the basis of the control signal PD0 corresponding to the predetermined signal. When the predetermined signal has the logic low level, the pull-down driver FD10 may be enabled based on the control signal PD0 having the logic high level, and drive the slave chip pad SDP with the low voltage VSSIO_EX. Conversely, when the predetermined signal has the logic high level, the pull-down driver FD10 may be disabled based on the control signal PD0 having the logic low level, and not drive the slave chip pad SDP with the low voltage VSSIO_EX.

Next, the operation of the semiconductor device in the power-off mode is described.

The master chip 110 may receive the high voltage VDDIO_EX and the low voltage VSSIO_EX. Each of the high voltage VDDIO_EX and the low voltage VSSIO_EX may be dedicated power that is continuously supplied regardless of whether a power mode of the slave chip 120 is the power-on mode or the power-off mode. The master chip 110 may maintain the master chip pad MDP at the first logic level corresponding to the high voltage VDDIO_EX.

The slave chip 120 may forcibly deactivate the control signal PD0 on the basis of the leakage prevention signal TIE_L. In the power-off mode, the control signal PD0 may be in a floating state, but may have the activation level according to a change in a voltage level of the master chip pad MDP by a parasitic capacitor formed between the slave chip pad SDP and the input terminal of the control signal PD0. In addition, in the power-off mode, the leakage prevention signal TIE_L may be a floating signal, but may have the activation level according to a change in the voltage level of the master chip pad MDP by a parasitic capacitor formed between the slave chip pad SDP and the input terminal of the leakage prevention signal TIE_L. However, when the control signal PD0 and the leakage prevention signal TIE_L are unintentionally activated, the slave chip 120 may forcibly deactivate the control signal PD0 and the leakage prevention signal TIE_L through a leakage prevention operation. The operation of the slave chip 120 in the power-off mode is described in more detail as follows.

As described above, the control signal PD0 may have the activation level according to a change in the voltage level of the master chip pad MDP by the parasitic capacitor formed between the slave chip pad SDP and the input terminal of the control signal PD0.

The leakage prevention driver LD10 may be enabled based on the leakage prevention signal TIE_L having the logic high level, and drive the input terminal of the control signal PD0 with the low voltage VSSIO_EX. Accordingly, the control signal PD0 may have the deactivation level, and the pull-down driver FD10 may be disabled based on the control signal PD0 having the deactivation level. The pull-down driver FD10 may electrically cut off a path between the slave chip pad SDP and the supply terminal of the low voltage VSSIO_EX, thereby preventing a leakage current occurring from the slave chip pad SDP to the supply terminal of the low voltage VSSIO_EX.

The dummy leakage prevention driver LD13 may be enabled based on the leakage prevention signal TIE_L having the logic high level, and drive the input terminal of the leakage prevention signal TIE_L with the low voltage VSSIO_EX. Accordingly, the leakage prevention signal TIE_L may have the deactivation level, and the dummy driver FD13 may be disabled based on the leakage prevention signal TIE_L having the deactivation level. The dummy driver FD13 may electrically cut off a path between the slave chip pad SDP and the supply terminal of the low voltage VSSIO_EX, thereby preventing a leakage current occurring from the slave chip pad SDP to the supply terminal of the low voltage VSSIO_EX.

Figure 3:
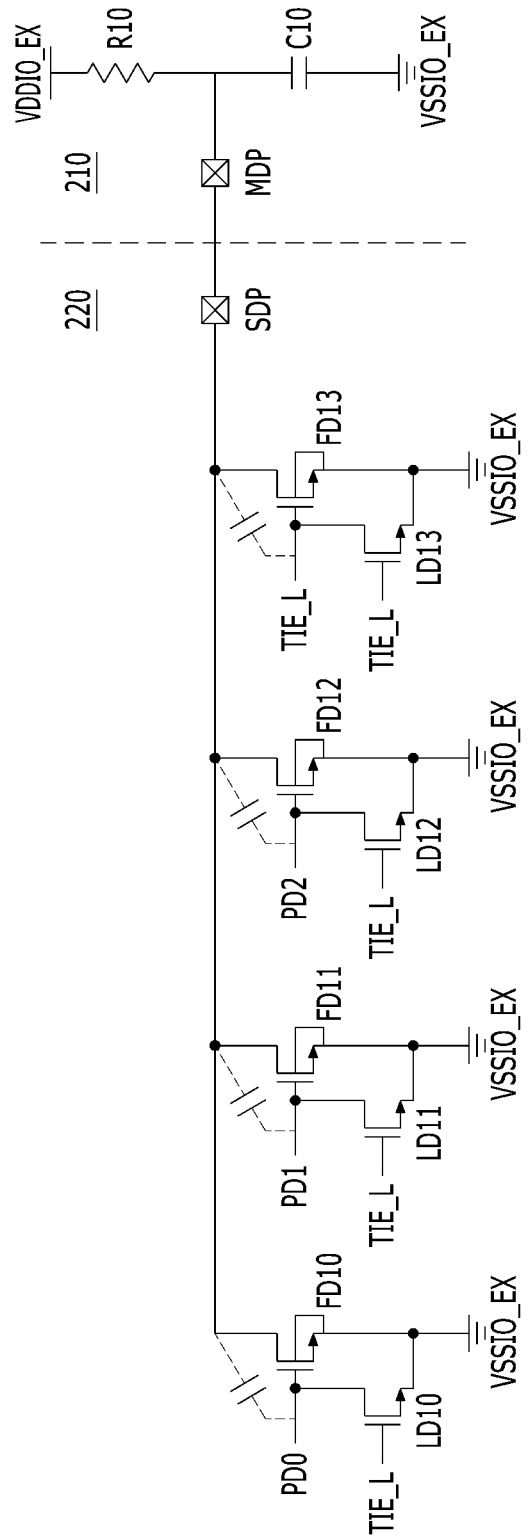
FIG. 3 is a circuit diagram illustrating another example of the semiconductor device illustrated in FIG. 1 in accordance with an embodiment of the present disclosure.

FIG. 3 is a circuit diagram illustrating another example of the semiconductor device illustrated in FIG. 1 in accordance with an embodiment of the present disclosure.

Referring to FIG. 3, a master chip 210 may maintain a master chip pad MDP at a first logic level corresponding to a high voltage VDDIO_EX. The first logic level may be a logic high level, i.e., "1", of a predetermined signal generated through the master chip pad MDP. The master chip 210 may use dedicated power of the master chip 210. The dedicated power of the master chip 210 may refer to the high voltage VDDIO_EX or a low voltage VSSIO_EX that is continuously supplied regardless of whether a slave chip 220 is in a power-on mode or a power-off mode.

For example, the master chip 210 may include a pull-up resistor R10, a capacitor C10 and the master chip pad MDP. Since the pull-up resistor R10, the capacitor C10 and the master chip pad MDP of the master chip 210 are the same as the pull-up resistor R10, the capacitor C10 and the master chip pad MDP of the master chip 110 illustrated in FIG. 1, detailed descriptions of the pull-up resistor R10, the capacitor C10 and the master chip pad MDP of the master chip 210 are omitted.

The slave chip 220 may selectively change the logic level of a slave chip pad SDP to a second logic level, which corresponds to the low voltage VSSIO_EX, on the basis of first to third control signals PD0, PD1 and PD2 in the power-on mode, and forcibly deactivate the first to third control signals PD0, PD1 and PD2 on the basis of a leakage prevention signal TIE_L in the power-off mode.

Each of the first to third control signals PD0, PD1 and PD2 may be a signal that is controlled to a logic low level or the logic high level in response to the predetermined signal in the power-on mode and controlled to a deactivation level in the power-off mode. In the power-off mode, each of the first to third control signals PD0, PD1 and PD2 may unintentionally have an activation level in a floating state. For example, each of the first to third control signals PD0, PD1 and PD2 may have the activation level according to a change in a voltage level of the master chip pad MDP by a parasitic capacitor formed between the slave chip pad SDP and an input terminal of each of the first to third control signals PD0, PD1 and PD2 in the power-off mode. When each of the first to third control signals PD0, PD1 and PD2 has the activation level in a floating state, a leakage current may occur from the slave chip pad SDP to a supply terminal of the low voltage VSSIO_EX. However, even though the first to third control signals PD0, PD1 and PD2 are unintentionally activated in the power-off mode, the slave chip 220 may prevent the leakage current by forcibly deactivating the first to third control signals PD0, PD1 and PD2. A case, i.e., a condition, in which the first to third control signals PD0, PD1 and PD2 are unintentionally activated in the power-off mode may be as follows. When a signal is transmitted between another slave chip and the master chip 210, the voltage level of the master chip pad MDP may change from a low voltage level to a high voltage level.

Alternatively, the voltage level of the master chip pad MDP may change to a relatively high voltage level due to an electric shock or stress.

The leakage prevention signal TIE_L may be a signal that has the logic level fixed to the logic low level regardless of the predetermined signal in the power-on mode and fixed to the logic high level in the power-off mode. In the power-off mode, the leakage prevention signal TIE_L may be in a floating state, but may forcibly have the logic high level according to an embodiment of the present disclosure. For example, the leakage prevention signal TIE_L may have the activation level according to a change in a voltage level of the master chip pad MDP by a parasitic capacitor formed between the slave chip pad SDP and an input terminal of the leakage prevention signal TIE_L in the power-off mode. When the leakage prevention signal TIE_L has the activation level in a floating state, a leakage current may occur from the slave chip pad SDP to the supply terminal of the low voltage VSSIO_EX. However, the slave chip 220 may prevent the leakage current by forcibly deactivating the leakage prevention signal TIE_L even though the leakage prevention signal TIE_L is unintentionally activated in the power-off mode. A case, that is, a condition, in which the leakage prevention signal TIE_L is unintentionally activated in the power-off mode may be as follows. When a signal is transmitted between another slave chip and the master chip 210, the voltage level of the master chip pad MDP may change from a low voltage level to a high voltage level. Alternatively, the voltage level of the master chip pad MDP may change to a relatively high voltage level due to an electric shock or stress.

The power-on mode may refer to a mode in which dedicated power of the slave chip 220 is supplied to the slave chip 220. For example, in the power-on mode, signals, for example, PD0, PD1, PD2 and TIE_L, may be normally generated based on the dedicated power of the slave chip 220 in the slave chip 220. The power-off mode may refer to a mode in which the dedicated power of the slave chip 220 is not supplied to the slave chip 220. For example, in the power-off mode, the signals, for example, PD0, PD1, PD2 and TIE_L, may be in a floating state in the slave chip 220. However, according to an embodiment of the present disclosure, in the power-off mode, the signals, for example, PD0, PD1, PD2 and TIE_L, may forcibly have the deactivation level even though the signals, for example, PD0, PD1, PD2 and TIE_L, unintentionally have the activation levels.

For example, the slave chip 220 may include a first pull-down driver FD10, a first leakage prevention driver LD10, a second pull-down driver FD11, a second leakage prevention driver LD11, a third pull-down driver FD12, a third leakage prevention driver LD12, a dummy driver FD13, a dummy leakage prevention driver LD13 and the slave chip pad SDP. Since the first pull-down driver FD10, the first leakage prevention driver LD10, the dummy driver FD13, the dummy leakage prevention driver LD13 and the slave chip pad SDP of the slave chip 220 are the same as the pull-down driver FD10, the leakage prevention driver LD10, the dummy driver FD13, the dummy leakage prevention driver LD13 and the slave chip pad SDP of the slave chip 120 illustrated in FIG. 1, detailed descriptions of the first pull-down driver FD10, the first leakage prevention driver LD10, the dummy driver FD13, the dummy leakage prevention driver LD13 and the slave chip pad SDP of the slave chip 220 are omitted. Hereinafter, the second pull-down driver FD11, the second leakage prevention driver LD11, the third pull-down driver FD12 and the third leakage prevention driver LD12 of the slave chip 220 are described.

The second pull-down driver FD11 may be connected between the slave chip pad SDP and the supply terminal of the low voltage VSSIO_EX. For example, the second pull-down driver FD11 may include an NMOS transistor having a gate terminal receiving the second control signal PD1 and a source terminal and a drain terminal connected between the slave chip pad SDP and the supply terminal of the low voltage VSSIO_EX.

The second pull-down driver FD11 may selectively drive the slave chip pad SDP with the low voltage VSSIO_EX on the basis of the second control signal PD1, which corresponds to the predetermined signal, in the power-on mode. When the predetermined signal has the logic low level, the second pull-down driver FD11 may be enabled or disabled based on the preset second control signal PD1. When the predetermined signal has the logic high level, the second pull-down driver FD11 may be disabled based on the second control signal PD1. When the second pull-down driver FD11 is enabled, the second pull-down driver FD11 may drive the slave chip pad SDP with the low voltage VSSIO_EX. When the second pull-down driver FD11 is disabled, the second pull-down driver FD11 may not drive the slave chip pad SDP with the low voltage VSSIO_EX.

The second pull-down driver FD11 may be disabled based on the second control signal PD1 having the logic low level in the power-off mode. That is, in the power-off mode, the second pull-down driver FD11 may electrically cut off a path between the slave chip pad SDP and the supply terminal of the low voltage VSSIO_EX, thereby preventing a leakage current occurring from the slave chip pad SDP to the supply terminal of the low voltage VSSIO_EX.

The second leakage prevention driver LD11 may be connected between an input terminal of the second control signal PD1 and the supply terminal of the low voltage VSSIO_EX. For example, the second leakage prevention driver LD11 may include an NMOS transistor having a gate terminal receiving the leakage prevention signal TIE_L and a source terminal and a drain terminal connected between the input terminal of the second control signal PD1 and the supply terminal of the low voltage VSSIO_EX.

The second leakage prevention driver LD11 may selectively drive the input terminal of the second control signal PD1 with the low voltage VSSIO_EX on the basis of the leakage prevention signal TIE_L. For example, the second leakage prevention driver LD11 may be disabled based on the leakage prevention signal TIE_L having the logic low level in the power-on mode, and drive the input terminal of the second control signal PD1 with the low voltage VSSIO_EX on the basis of the leakage prevention signal TIE_L having the logic high level in the power-off mode.

The third pull-down driver FD12 may be connected between the slave chip pad SDP and the supply terminal of the low voltage VSSIO_EX. For example, the third pull-down driver FD12 may include an NMOS transistor having a gate terminal receiving the third control signal PD2 and a source terminal and a drain terminal connected between the slave chip pad SDP and the supply terminal of the low voltage VSSIO_EX.

The third pull-down driver FD12 may selectively drive the slave chip pad SDP with the low voltage VSSIO_EX on the basis of the third control signal PD2, which corresponds to the predetermined signal, in the power-on mode. When the predetermined signal has the logic low level, the third pull-down driver FD12 may be enabled or disabled based on the preset third control signal PD2. When the predetermined signal has the logic high level, the third pull-down driver FD12 may be disabled based on the third control signal PD2. When the third pull-down driver FD12 is enabled, the third pull-down driver FD12 may drive the slave chip pad SDP with the low voltage VSSIO_EX. When the third pull-down driver FD12 is disabled, the third pull-down driver FD12 may not drive the slave chip pad SDP with the low voltage VSSIO_EX.

The third pull-down driver FD12 may be disabled based on the third control signal PD2 having the logic low level in the power-off mode. That is, in the power-off mode, the third pull-down driver FD12 may electrically cut off a path between the slave chip pad SDP and the supply terminal of the low voltage VSSIO_EX, thereby preventing a leakage current occurring from the slave chip pad SDP to the supply terminal of the low voltage VSSIO_EX.

The third leakage prevention driver LD12 may be connected between an input terminal of the third control signal PD2 and the supply terminal of the low voltage VSSIO_EX. For example, the third leakage prevention driver LD12 may include an NMOS transistor having a gate terminal receiving the leakage prevention signal TIE_L and a source terminal and a drain terminal connected between the input terminal of the third control signal PD2 and the supply terminal of the low voltage VSSIO_EX.

The third leakage prevention driver LD12 may selectively drive the input terminal of the third control signal PD2 with the low voltage VSSIO_EX on the basis of the leakage prevention signal TIE_L. For example, the third leakage prevention driver LD12 may be disabled based on the leakage prevention signal TIE_L having the logic low level in the power-on mode, and drive the input terminal of the third control signal PD2 with the low voltage VSSIO_EX on the basis of the leakage prevention signal TIE_L having the logic high level in the power-off mode.

Hereinafter, an operation of the semiconductor device in accordance with a second embodiment of the present disclosure, which has the above-described configuration, is described.

First, the operation of the semiconductor device in the power-on mode is described.

The master chip 210 may receive the high voltage VDDIO_EX and the low voltage VSSIO_EX. Each of the high voltage VDDIO_EX and the low voltage VSSIO_EX may be dedicated power that is continuously supplied regardless of whether the slave chip 220 is in the power-on mode or the power-off mode. The master chip 210 may maintain the master chip pad MDP at the first logic level corresponding to the high voltage VDDIO_EX. For example, the first logic level may be a logic high level, i.e., "1", of the predetermined signal generated through the master chip pad MDP.

The slave chip 220 may selectively change the logic level of the slave chip pad SDP to the second logic level corresponding to the low voltage VSSIO_EX, on the basis of the first to third control signals PD0, PD1 and PD2 and the leakage prevention signal TIE_L. When the predetermined signal corresponds to the logic low level, the slave chip 220 may drive the slave chip pad SDP with the low voltage VSSIO_EX. Conversely, when the predetermined signal corresponds to the logic high level, the slave chip 220 may not drive the slave chip pad SDP with the low voltage VSSIO_EX. The operation of the slave chip 220 in the power-on mode is described in more detail as follows.

The dummy driver FD13 may be disabled based on the leakage prevention signal TIE_L having the logic low level. The dummy driver FD13 may electrically cut off a path between the slave chip pad SDP and the supply terminal of the low voltage VSSIO_EX, thereby having no effect on the slave chip pad SDP.

Each of the first to third leakage prevention drivers LD10, LD11 and LD12 and the dummy leakage prevention driver LD13 may be disabled based on the leakage prevention signal TIE_L having the logic low level.

The first to third pull-down drivers FD10, FD11 and FD12 may selectively drive the slave chip pad SDP with the low voltage VSSIO_EX on the basis of the first to third control signals PD0, PD1 and PD2 corresponding to the predetermined signal. When the predetermined signal has the logic low level, at least one of the first to third pull-down drivers FD10, FD11 and FD12 may be enabled based on the first to third control signals PD0, PD1 and PD2, and drive the slave chip pad SDP with the low voltage VSSIO_EX. Conversely, when the predetermined signal has the logic high level, all of the first to third pull-down drivers FD10, FD11 and FD12 may be disabled based on the first to third control signals PD0, PD1 and PD2, and not drive the slave chip pad SDP with the low voltage VSSIO_EX.

Next, the operation of the semiconductor device in the power-off mode is described.

The master chip 210 may receive the high voltage VDDIO_EX and the low voltage VSSIO_EX. Each of the high voltage VDDIO_EX and the low voltage VSSIO_EX may be dedicated power that is continuously supplied regardless of whether the slave chip 220 is in the power-on mode or the power-off mode. The master chip 210 may maintain the master chip pad MDP at the first logic level corresponding to the high voltage VDDIO_EX.

The slave chip 220 may forcibly deactivate the first to third control signals PD0, PD1 and PD2 and the leakage prevention signal TIE_L on the basis of the leakage prevention signal TIE_L. Although each of the first to third control signals PD0, PD1 and PD2 may be in a floating state in the power-off mode, each of the first to third control signals PD0, PD1 and PD2 may have the activation level according to a change in a voltage level of the master chip pad MDP by a parasitic capacitor formed between the slave chip pad SDP and the input terminal of each of the first to third control signals PD0, PD1 and PD2. In addition, although the leakage prevention signal TIE_L may be in a floating state in the power-off mode, the leakage prevention signal TIE_L may have the activation level according to a change in the voltage level of the master chip pad MDP by a parasitic capacitor formed between the slave chip pad SDP and the input terminal of the leakage prevention signal TIE_L. However, when the first to third control signals PD0, PD1 and PD2 and the leakage prevention signal TIE_L are unintentionally activated, the slave chip 220 may forcibly deactivate the first to third control signals PD0, PD1 and PD2 and the leakage prevention signal TIE_L through a leakage prevention operation. The operation of the slave chip 220 in the power-off mode is described in more detail as follows.

As described above, each of the first to third control signals PD0, PD1 and PD2 may have the logic high level according to a change in the voltage level of the master chip pad MDP by the parasitic capacitor formed between the slave chip pad SDP and the input terminal of each of the first to third control signals PD0, PD1 and PD2.

The first to third leakage prevention drivers LD10, LD11 and LD12 may each be enabled based on the leakage prevention signal TIE_L having the activation level, and drive the input terminals of the first to third control signals PD0, PD1 and PD2 with the low voltage VSSIO_EX, respectively. Accordingly, each of the first to third control signals PD0, PD1 and PD2 may have the deactivation level, and the first to third pull-down drivers FD10, FD11 and FD12 may be disabled based on the first to third control signals PD0, PD1 and PD2 each having the deactivation level. Each of the first to third pull-down drivers FD10, FD11 and FD12 may electrically cut off a path between the slave chip pad SDP and the supply terminal of the low voltage VSSIO_EX, thereby preventing a leakage current occurring from the slave chip pad SDP to the supply terminal of the low voltage VSSIO_EX.

The dummy leakage prevention driver LD13 may be enabled based on the leakage prevention signal TIE_L having the activation level, and drive the input terminal of the leakage prevention signal TIE_L with the low voltage VSSIO_EX. Accordingly, the leakage prevention signal TIE_L may have the deactivation level, and the dummy driver FD13 may be disabled based on the leakage prevention signal TIE_L having the deactivation level. The dummy driver FD13 may electrically cut off a path between the slave chip pad SDP and the supply terminal of the low voltage VSSIO_EX, thereby preventing a leakage current occurring from the slave chip pad SDP to the supply terminal of the low voltage VSSIO_EX.

Figure 4:
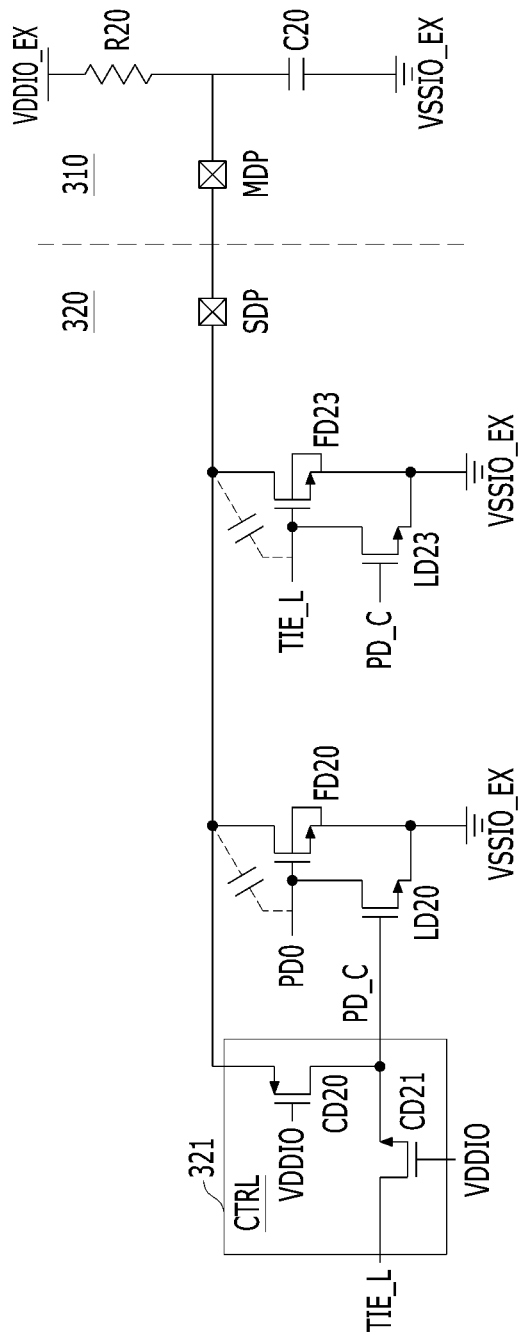
FIG. 4 is a circuit diagram illustrating yet another example of the semiconductor device illustrated in FIG. 1 in accordance with an embodiment of the present disclosure.

FIG. 4 is a circuit diagram illustrating yet another example of the semiconductor device illustrated in FIG. 1 in accordance with an embodiment of the present disclosure.

Referring to FIG. 4, a master chip 310 may maintain a master chip pad MDP at a first logic level corresponding to a high voltage VDDIO_EX. The first logic level may be a logic high level, i.e., "1", of a predetermined signal generated through the master chip pad MDP. The master chip 310 may use dedicated power of the master chip 310. The dedicated power of the master chip 310 may refer to the high voltage VDDIO_EX or a low voltage VSSIO_EX that is continuously supplied regardless of whether a slave chip 320 is in a power-on mode or a power-off mode.

For example, the master chip 310 may include a pull-up resistor R20, a capacitor C20 and the master chip pad MDP.

The pull-up resistor R20 may be connected between a supply terminal of the high voltage VDDIO_EX and the master chip pad MDP.

The capacitor C20 may be connected between the master chip pad MDP and a supply terminal of the low voltage VSSIO_EX.

The master chip pad MDP may be maintained at the first logic level by the pull-up resistor R20, and the logic level of the master chip pad MDP may change, that is, switch or transition, from the first logic level to a second logic level depending on the slave chip 320. The second logic level may be a logic low level, i.e., "0", of the predetermined signal generated through the master chip pad MDP.

The slave chip 320 may selectively change the logic level of the slave chip pad SDP to the second logic level, which corresponds to the low voltage VSSIO_EX, on the basis of a control signal PD0 in the power-on mode, and forcibly deactivate the control signal PD0 on the basis of a tie control signal TIE_L in the power-off mode.

The control signal PD0 may have the logic low level or the logic high level in response to the predetermined signal in the power-on mode, and have the logic low level in the power-off mode using a floating state. In the power-off mode, the control signal PD0 may be unintentionally activated in a floating state. For example, in the power-off mode, the control signal PD0 may have the logic high level according to a change in a voltage level of the master chip pad MDP by a parasitic capacitor formed between the slave chip pad SDP and an input terminal of the control signal PD0. When the control signal PD0 has the activation level in a floating state, a leakage current may occur from the slave chip pad SDP to the supply terminal of the low voltage VSSIO_EX. However, in the power-off mode, the slave chip 320 may prevent the leakage current by forcibly deactivating the control signal PD0 even though the control signal PD0 is unintentionally activated. A case, i.e., a condition, in which the control signal PD0 is unintentionally activated in the power-off mode may be as follows. When a signal is transmitted between another slave chip and the master chip 310, the voltage level of the master chip pad MDP may change from a low voltage level to a high voltage level. Alternatively, the voltage level of the master chip pad MDP may change to a relatively high voltage level due to an electric shock or stress.

The tie control signal TIE_L may have the logic low level regardless of the predetermined signal in the power-on mode, and have an activation level corresponding to the logic high level in the power-off mode. In the power-off mode, the tie control signal TIE_L may be in a floating state or have the activation level unintentionally. For example, in the power-off mode, the tie control signal TIE_L may have the activation level according to a change in the voltage level of the master chip pad MDP by a parasitic capacitor formed between the slave chip pad SDP and an input terminal of the tie control signal TIE_L. When the tie control signal TIE_L has the activation level in a floating state, a leakage current may occur from the slave chip pad SDP to the supply terminal of the low voltage VSSIO_EX. However, in the power-off mode, the slave chip 320 may prevent the leakage current by forcibly deactivating the tie control signal TIE_L even though the tie control signal TIE_L is unintentionally activated. A case, i.e., a condition, in which the tie control signal TIE_L is unintentionally activated in the power-off mode may be as follows. When a signal is transmitted between another slave chip and the master chip 310, the voltage level of the master chip pad MDP may change from a low voltage level to a high voltage level. Alternatively, the voltage level of the master chip pad MDP may change to a relatively high voltage level due to an electric shock or stress.

The power-on mode may refer to a mode in which dedicated power of the slave chip 320 is supplied to the slave chip 320. For example, in the power-on mode, predetermined signals, for example, PD0 and TIE_L, may be normally generated in the slave chip 320 based on the dedicated power of the slave chip 320. The power-off mode may refer to a mode in which the dedicated power of the slave chip 320 is not supplied to the slave chip 320. For example, in the power-off mode, signals, for example, PD0 and TIE_L, may be in a floating state in the slave chip 320. However, according to an embodiment of the present disclosure, in the power-off mode, the signals, for example, PD0 and TIE_L, may have forcibly have the deactivation levels even though the signals, for example, PD0 and TIE_L, unintentionally have the activation levels.

For example, the slave chip 320 may include a pull-down driver FD20, a leakage prevention driver LD20, a dummy driver FD23, a dummy leakage prevention driver LD23, a controller 321 and the slave chip pad SDP.

The pull-down driver FD20 may be connected between the slave chip pad SDP and the supply terminal of the low voltage VSSIO_EX. For example, the pull-down driver FD20 may include an NMOS transistor having a gate terminal receiving the control signal PD0 and a source terminal and a drain terminal connected between the slave chip pad SDP and the supply terminal of the low voltage VSSIO_EX.

The pull-down driver FD20 may selectively drive the slave chip pad SDP with the low voltage VSSIO_EX on the basis of the control signal PD0 corresponding to the predetermined signal in the power-on mode. When the predetermined signal has the logic low level, the pull-down driver FD20 may be enabled based on the control signal PD0 and drive the slave chip pad SDP with the low voltage VSSIO_EX. When the predetermined signal has the logic high level, the pull-down driver FD20 may be disabled based on the control signal PD0. The pull-down driver FD20 may be disabled based on the control signal PD0 having the deactivation level by the leakage prevention driver LD20 in the power-off mode. That is, in the power-off mode, the pull-down driver FD20 may electrically cut off a path between the slave chip pad SDP and the supply terminal of the low voltage VSSIO_EX, thereby preventing a leakage current occurring from the slave chip pad SDP to the supply terminal of the low voltage VSSIO_EX.

The leakage prevention driver LD20 may be connected between the input terminal of the control signal PD0 and the supply terminal of the low voltage VSSIO_EX. For example, the leakage prevention driver LD20 may include an NMOS transistor having a gate terminal receiving a leakage prevention signal PD_C and a source terminal and a drain terminal connected between the input terminal of the control signal PD0 and the supply terminal of the low voltage VSSIO_EX.

The leakage prevention driver LD20 may selectively drive the control signal PD0 with the low voltage VSSIO_EX on the basis of the leakage prevention signal PD_C. For example, the leakage prevention driver LD20 may be disabled based on the leakage prevention signal PD_C having the logic low level in the power-on mode, and drive the input terminal of the control signal PD0 with low voltage VSSIO_EX on the basis of the leakage prevention signal PD_C having the activation level in the power-off mode.

The dummy driver FD23 may be connected between the slave chip pad SDP and the supply terminal of the low voltage VSSIO_EX. For example, the dummy driver FD13 may include an NMOS transistor having a gate terminal receiving the tie control signal TIE_L and a source terminal and a drain terminal connected between the slave chip pad SDP and the supply terminal of the low voltage VSSIO_EX.

The dummy driver FD23 may be disabled based on the tie control signal TIE_L in the power-on mode and the power-off mode. In the power-on mode and the power-off mode, the dummy driver FD23 may electrically cut off a path between the slave chip pad SDP and the supply terminal of the low voltage VSSIO_EX, thereby having no effect on the slave chip pad SDP. Particularly, in the power-off mode, as described above, the tie control signal TIE_L may be in a floating state, but may have the activation level according to a change in the voltage level of the master chip pad MDP by the parasitic capacitor formed between the slave chip pad SDP and the input terminal of the tie control signal TIE_L. When the tie control signal TIE_L has the activation level, the dummy leakage prevention driver LD23 may convert the tie control signal TIE_L having the activation level into the tie control signal TIE_L having the deactivation level corresponding to the low voltage VSSIO_EX, and thus the dummy driver FD23 may be disabled.

The dummy leakage prevention driver LD23 may be connected between the input terminal of the tie control signal TIE_L and the supply terminal of the low voltage VSSIO_EX. For example, the dummy leakage prevention driver LD23 may include an NMOS transistor having a gate terminal receiving the leakage prevention signal PD_C and a source terminal and a drain terminal connected between the input terminal of the tie control signal TIE_L and the supply terminal of the low voltage VSSIO_EX.

The dummy leakage prevention driver LD23 may selectively drive the input terminal of the tie control signal TIE_L with the low voltage VSSIO_EX on the basis of the leakage prevention signal PD_C. For example, the dummy leakage prevention driver LD23 may be disabled based on the leakage prevention signal PD_C having the logic low level in the power-on mode, and drive the input terminal of the control signal PD0 with the low voltage VSSIO_EX on the basis of the leakage prevention signal PD_C having the logic high level in the power-off mode.

The controller 321 may be connected between the slave chip pad SDP and an output terminal of the leakage prevention signal PD_C. The controller 321 may generate the leakage prevention signal PD_C on the basis of a mode signal VDDIO indicating the power-on mode or the power-off mode, and the tie control signal TIE_L. For example, the controller 321 may generate the leakage prevention signal PD_C having a logic low level corresponding to a voltage level of the tie control signal TIE_L in the power-on mode, and generate the leakage prevention signal PD_C corresponding to a voltage level of the slave chip pad SDP in the power-off mode.

The controller 321 may include a first connector CD20 and a second connector CD21.

The first connector CD20 may be connected between the slave chip pad SDP and the output terminal of the leakage prevention signal PD_C. For example, the first connector CD20 may include a PMOS transistor having a gate terminal receiving the mode signal VDDIO and a source terminal and a drain terminal connected between the slave chip pad SDP and the output terminal of the leakage prevention signal PD_C. The first connector CD20 may electrically connect the slave chip pad SDP to the output terminal of the leakage prevention signal PD_C in the power-off mode on the basis of the mode signal VDDIO. The first connector CD20 may electrically disconnect the slave chip pad SDP from the output terminal of the leakage prevention signal PD_C in the power-on mode on the basis of the mode signal VDDIO.

The second connector CD21 may be connected between the input terminal of the tie control signal TIE_L and the output terminal of the leakage prevention signal PD_C. For example, the second connector CD21 may include an NMOS transistor having a gate terminal receiving the mode signal VDDIO and a source terminal and a drain terminal connected between the input terminal of the tie control signal TIE_L and the output terminal of the leakage prevention signal PD_C. The second connector CD21 may electrically connect the input terminal of the tie control signal TIE_L to the output terminal of the leakage prevention signal PD_C in the power-on mode on the basis of the mode signal VDDIO. The second connector CD21 may electrically disconnect the input terminal of the tie control signal TIE_L from the output terminal of the leakage prevention signal PD_C in the power-off mode on the basis of the mode signal VDDIO.

The slave chip pad SDP may be connected to the master chip pad MDP. The slave chip pad SDP may output the predetermined signal having the logic low level or the logic high level according to the control signal PD0 in the power-on mode, and be maintained at the logic high level by the master chip pad MDP in the power-off mode.

Hereinafter, an operation of the semiconductor device in accordance with a third embodiment of the present disclosure, which has the above-described configuration, is described.

First, the operation of the semiconductor device in the power-on mode is described.

The master chip 310 may receive the high voltage VDDIO_EX and the low voltage VSSIO_EX. Each of the high voltage VDDIO_EX and the low voltage VSSIO_EX may be dedicated power that is continuously supplied regardless of whether the slave chip 320 is in the power-on mode or the power-off mode. The master chip 310 may maintain the master chip pad MDP at the first logic level corresponding to the high voltage VDDIO_EX. For example, the first logic level may be a logic high level, i.e., "1", of the predetermined signal generated through the master chip pad MDP.

The slave chip 320 may selectively change the logic level of the slave chip pad SDP to the second logic level corresponding to the low voltage VSSIO_EX, on the basis of the mode signal VDDIO, the control signal PD0 and the tie control signal TIE_L. When the predetermined signal corresponds to the logic low level, the slave chip 320 may drive the slave chip pad SDP with the low voltage VSSIO_EX. Conversely, when the predetermined signal corresponds to the logic high level, the slave chip 320 may not drive the slave chip pad SDP with the low voltage VSSIO_EX. The operation of the slave chip 320 in the power-on mode is described in more detail as follows.

The controller 321 may electrically connect the input terminal of the tie control signal TIE_L to the output terminal of the leakage prevention signal PD_C on the basis of the mode signal VDDIO corresponding to the power-on mode. The controller 321 may electrically disconnect the slave chip pad SDP from the output terminal of the leakage prevention signal PD_C on the basis of the mode signal VDDIO corresponding to the power-on mode. The controller 321 may generate the leakage prevention signal PD_C having a logic low level corresponding to the voltage level of the tie control signal TIE_L.

Each of the leakage prevention driver LD20 and the dummy leakage prevention driver LD23 may be disabled based on the leakage prevention signal PD_C having the logic low level.

The pull-down driver FD20 may selectively drive the slave chip pad SDP with the low voltage VSSIO_EX on the basis of the control signal PD0 corresponding to the predetermined signal. When the predetermined signal has the logic low level, the pull-down driver FD20 may be enabled based on the control signal PD0, and drive the slave chip pad SDP with the low voltage VSSIO_EX. Conversely, when the predetermined signal has the logic high level, the pull-down driver FD20 may be disabled based on the control signal PD0, and not drive the slave chip pad SDP with the low voltage VSSIO_EX.

The dummy driver FD23 may be disabled based on the leakage prevention signal PD_C having the logic low level. The dummy driver FD23 may electrically cut off a path between the slave chip pad SDP and the supply terminal of the low voltage VSSIO_EX, thereby having no effect on the slave chip pad SDP.

Next, the operation of the semiconductor device in the power-off mode is described.

The master chip 310 may receive the high voltage VDDIO_EX and the low voltage VSSIO_EX. Each of the high voltage VDDIO_EX and the low voltage VSSIO_EX may be dedicated power that is continuously supplied regardless of whether the slave chip 320 is in the power-on mode or the power-off mode. The master chip 310 may maintain the master chip pad MDP at the first logic level corresponding to the high voltage VDDIO_EX.

The slave chip 320 may forcibly deactivate the control signal PD0 and the tie control signal TIE_L on the basis of the leakage prevention signal PD_C. The control signal PD0 may be unintentionally activated in a floating state in the power-off mode. For example, the control signal PD0 may have the activation level according to a change in the voltage level of the master chip pad MDP by a parasitic capacitor formed between the slave chip pad SDP and the input terminal of the control signal PD0. In addition, the tie control signal TIE_L may be unintentionally activated in a floating state in the power-off mode. For example, the tie control signal TIE_L may have the activation level according to the voltage level of the master chip pad MDP by a parasitic capacitor formed between the slave chip pad SDP and the input terminal of the tie control signal TIE_L. However, in the power-off mode, the slave chip 320 may forcibly deactivate the control signal PD0 and the tie control signal TIE_L through a leak prevention operation when the control signal PD0 and the tie control signal TIE_L are unintentionally activated. The operation of the slave chip 320 in the power-off mode is described in more detail as follows.

The controller 321 may electrically connect the slave chip pad SDP to the output terminal of the leakage prevention signal PD_C on the basis of the mode signal VDDIO corresponding to the power-off mode. The controller 321 may electrically disconnect the input terminal of the tie control signal TIE_L from the output terminal of the leakage prevention signal PD_C on the basis of the mode signal VDDIO corresponding to the power-off mode. The controller 321 may generate the leakage prevention signal PD_C having the activation level corresponding to the voltage level of the slave chip pad SDP.

As described above, the control signal PD0 may have the activation level according to a change in the voltage level of the master chip pad MDP by the parasitic capacitor formed between the slave chip pad SDP and the input terminal of the control signal PD0.

The leakage prevention driver LD20 may be enabled based on the leakage prevention signal PD_C having the activation level, and drive the input terminal of the control signal PD0 with the low voltage VSSIO_EX. Accordingly, the control signal PD0 may have the deactivation level, and the pull-down driver FD20 may be disabled based on the control signal PD0 having the deactivation level. The pull-down driver FD20 may electrically cut off a path between the slave chip pad SDP and the supply terminal of the low voltage VSSIO_EX, thereby preventing a leakage current occurring from the slave chip pad SDP to the supply terminal of the low voltage VSSIO_EX.

The dummy leakage prevention driver LD23 may be enabled based on the leakage prevention signal PD_C having the activation level, and drive the input terminal of the tie control signal TIE_L with the low voltage VSSIO_EX. Accordingly, the tie control signal TIE_L may have the deactivation level, and the dummy driver FD23 may be disabled based on the tie control signal TIE_L having the deactivation level. The dummy driver FD23 may electrically cut off a path between the slave chip pad SDP and the supply terminal of the low voltage VSSIO_EX, thereby preventing a leakage current occurring from the slave chip pad SDP to the supply terminal of the low voltage VSSIO_EX.

Figure 5:
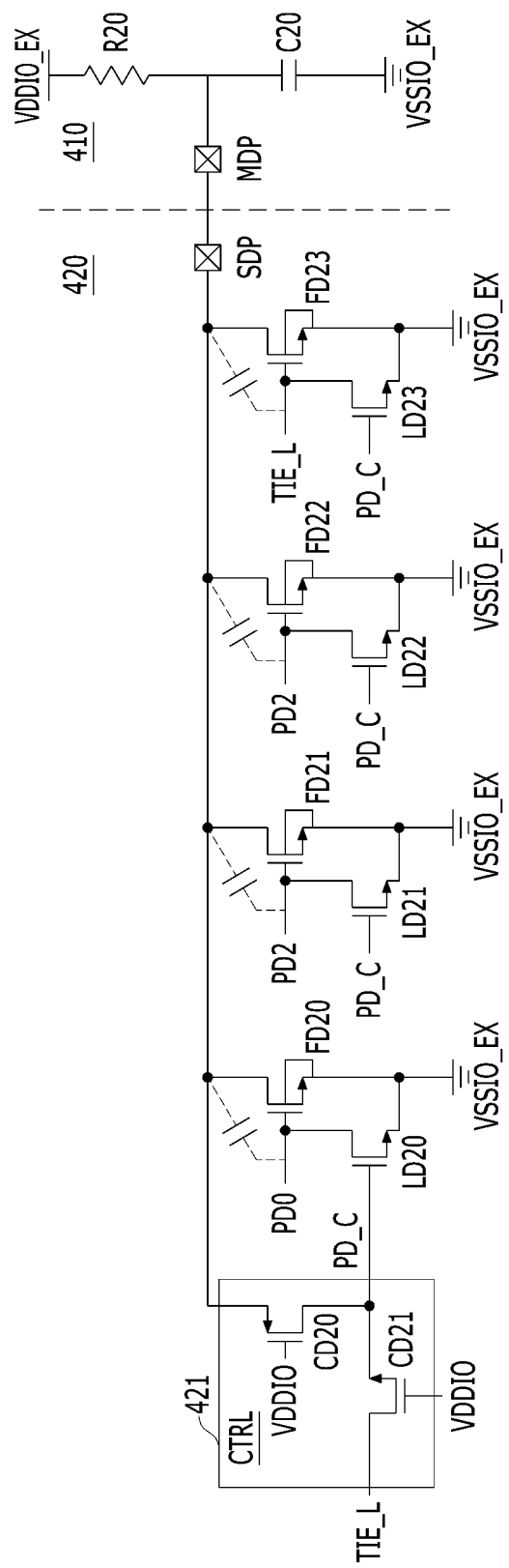
FIG. 5 is a circuit diagram illustrating still yet another example of the semiconductor device illustrated in FIG. 1 in accordance with an embodiment of the present disclosure.

FIG. 5 is a circuit diagram illustrating still yet another example of the semiconductor device illustrated in FIG. 1 in accordance with an embodiment of the present disclosure.

Referring to FIG. 5, a master chip 410 may maintain a master chip pad MDP at a first logic level corresponding to a high voltage VDDIO_EX. The first logic level may be a logic high level, i.e., "1", of a predetermined signal generated through the master chip pad MDP. The master chip 410 may use dedicated power of the master chip 410. The dedicated power of the master chip 410 may refer to the high voltage VDDIO_EX or a low voltage VSSIO_EX that is continuously supplied regardless of whether a slave chip 420 is in a power-on mode or a power-off mode.

For example, the master chip 410 may include a pull-up resistor R20, a capacitor C20 and the master chip pad MDP. Since the pull-up resistor R20, the capacitor C20 and the master chip pad MDP of the master chip 410 are the same as the pull-up resistor R20, the capacitor C20 and the master chip pad MDP of the master chip 310 illustrated in FIG. 3, detailed descriptions of the pull-up resistor R20, the capacitor C20 and the master chip pad MDP of the master chip 410 are omitted.

The slave chip 420 may selectively change the logic level of a slave chip pad SDP to the second logic level, which corresponds to the low voltage VSSIO_EX, on the basis of first to third control signals PD0, PD1 and PD2 and a tie control signal TIE_L in the power-on mode, and forcibly deactivate the first to third control signals PD0, PD1 and PD2 on the basis of a leakage prevention signal PD_C in the power-off mode.

Each of the first to third control signals PD0, PD1 and PD2 may have the logic low level or the logic high level in response to the predetermined signal in the power-on mode, and have a deactivation level corresponding to the logic low level in the power-off mode. In the power-off mode, each of the first to third control signals PD0, PD1 and PD2 may unintentionally have an activation level in a floating state. In addition, each of the first to third control signals PD0, PD1 and PD2 may have the activation level according to a change in a voltage level of the master chip pad MDP by a parasitic capacitor formed between the slave chip pad SDP and an input terminal of each of the first to third control signals PD0, PD1 and PD2 in the power-off mode. When each of the first to third control signals PD0, PD1 and PD2 has the activation level in the floating state, a leakage current may occur from the slave chip pad SDP to a supply terminal of the low voltage VSSIO_EX. However, even though the first to third control signals PD0, PD1 and PD2 are unintentionally activated in the power-off mode, the slave chip 420 may prevent the leakage current by forcibly deactivating the first to third control signals PD0, PD1 and PD2. A case, i.e., a condition, in which the first to third control signals PD0, PD1 and PD2 are unintentionally activated in the power-off mode may be as follows. When a signal is transmitted between another slave chip and the master chip 410, the voltage level of the master chip pad MDP may change from a low voltage level to a high voltage level. Alternatively, the voltage level of the master chip pad MDP may change to a relatively high voltage level due to an electric shock or stress.

The tie control signal TIE_L may a logic low level regardless of the predetermined signal in the power-on mode and be in a floating state in the power-off mode. The tie control signal TIE_L may unintentionally have the activation level in a floating state in the power-off mode. For example, the tie control signal TIE_L may have the activation level according to a change in a voltage level of the master chip pad MDP by a parasitic capacitor formed between the slave chip pad SDP and an input terminal of the tie control signal TIE_L in the power-off mode. When the tie control signal TIE_L has the activation level in the floating state, a leakage current may occur from the slave chip pad SDP to the supply terminal of the low voltage VSSIO_EX. However, the slave chip 420 may prevent the leakage current by forcibly deactivating the tie control signal TIE_L even though the tie control signal TIE_L is unintentionally activated in the power-off mode. A case, that is, a condition, in which the tie control signal TIE_L is unintentionally activated in the power-off mode may be as follows. When a signal is transmitted between another slave chip and the master chip 410, the voltage level of the master chip pad MDP may change from a low voltage level to a high voltage level. Alternatively, the voltage level of the master chip pad MDP may change to a relatively high voltage level due to an electric shock or stress.

The power-on mode may refer to a mode in which dedicated power of the slave chip 420 is supplied to the slave chip 420. For example, in the power-on mode, predetermined signals, for example, PD0, PD1, PD2 and TIE_L, may be normally generated based on the dedicated power of the slave chip 420 in the slave chip 420. The power-off mode may refer to a mode in which the dedicated power of the slave chip 420 is not supplied to the slave chip 420. Accordingly, in the power-off mode, the predetermined signals, for example, PD0, PD1, PD2 and TIE_L, may be in a floating state in the slave chip 420.

For example, the slave chip 420 may include a first pull-down driver FD20, a first leakage prevention driver LD20, a second pull-down driver FD21, a second leakage prevention driver LD21, a third pull-down driver FD22, a third leakage prevention driver LD22, a dummy driver FD23, a dummy leakage prevention driver LD23, a controller 421 and the slave chip pad SDP. Since the first pull-down driver FD20, the first leakage prevention driver LD20, the dummy driver FD23, the dummy leakage prevention driver LD23, the controller 421 and the slave chip pad SDP of the slave chip 420 are the same as the pull-down driver FD20, the leakage prevention driver LD20, the dummy driver FD23, the dummy leakage prevention driver LD23, the controller 321 and the slave chip pad SDP of the slave chip 320 illustrated in FIG. 3, detailed descriptions of the first pull-down driver FD20, the first leakage prevention driver LD20, the dummy driver FD23, the dummy leakage prevention driver LD23, the controller 421 and the slave chip pad SDP of the slave chip 420 are omitted. Hereinafter, the second pull-down driver FD21, the second leakage prevention driver LD21, the third pull-down driver FD22 and the third leakage prevention driver LD22 of the slave chip 420 are described.

The second pull-down driver FD21 may be connected between the slave chip pad SDP and the supply terminal of the low voltage VSSIO_EX. For example, the second pull-down driver FD21 may include an NMOS transistor having a gate terminal receiving the second control signal PD1 and a source terminal and a drain terminal connected between the slave chip pad SDP and the supply terminal of the low voltage VSSIO_EX.

The second pull-down driver FD21 may selectively drive the slave chip pad SDP with the low voltage VSSIO_EX on the basis of the second control signal PD1, which corresponds to the predetermined signal, in the power-on mode. When the predetermined signal has the logic low level, the second pull-down driver FD21 may be enabled or disabled based on the preset second control signal PD1. When the predetermined signal has the logic high level, the second pull-down driver FD21 may be disabled based on the second control signal PD1. When the second pull-down driver FD21 is enabled, the second pull-down driver FD21 may drive the slave chip pad SDP with the low voltage VSSIO_EX. When the second pull-down driver FD21 is disabled, the second pull-down driver FD21 may not drive the slave chip pad SDP with the low voltage VSSIO_EX.

The second pull-down driver FD21 may be disabled based on the second control signal PD1 having the deactivation level in the power-off mode. That is, in the power-off mode, the second pull-down driver FD21 may electrically cut off a path between the slave chip pad SDP and the supply terminal of the low voltage VSSIO_EX, thereby preventing a leakage current occurring from the slave chip pad SDP to the supply terminal of the low voltage VSSIO_EX.

The second leakage prevention driver LD21 may be connected between an input terminal of the second control signal PD1 and the supply terminal of the low voltage VSSIO_EX. For example, the second leakage prevention driver LD21 may include an NMOS transistor having a gate terminal receiving the leakage prevention signal PD_C and a source terminal and a drain terminal connected between the input terminal of the second control signal PD1 and the supply terminal of the low voltage VSSIO_EX.

The second leakage prevention driver LD21 may selectively drive the input terminal of the second control signal PD1 with the low voltage VSSIO_EX on the basis of the leakage prevention signal PD_C. For example, the second leakage prevention driver LD21 may be disabled based on the leakage prevention signal PD_C having the logic low level in the power-on mode, and drive the input terminal of the second control signal PD1 with the low voltage VSSIO_EX on the basis of the leakage prevention signal PD_C having the activation level in the power-off mode.

The third pull-down driver FD22 may be connected between the slave chip pad SDP and the supply terminal of the low voltage VSSIO_EX. For example, the third pull-down driver FD22 may include an NMOS transistor having a gate terminal receiving the third control signal PD2 and a source terminal and a drain terminal connected between the slave chip pad SDP and the supply terminal of the low voltage VSSIO_EX.

The third pull-down driver FD22 may selectively drive the slave chip pad SDP with the low voltage VSSIO_EX on the basis of the third control signal PD2, which corresponds to the predetermined signal, in the power-on mode. When the predetermined signal has the logic low level, the third pull-down driver FD22 may be enabled or disabled based on the preset third control signal PD2. When the predetermined signal has the logic high level, the third pull-down driver FD22 may be disabled based on the third control signal PD2. When the third pull-down driver FD22 is enabled, the third pull-down driver FD22 may drive the slave chip pad SDP with the low voltage VSSIO_EX. When the third pull-down driver FD22 is disabled, the third pull-down driver FD22 may not drive the slave chip pad SDP with the low voltage VSSIO_EX.

The third pull-down driver FD22 may be disabled based on the third control signal PD2 having the deactivation level in the power-off mode. That is, in the power-off mode, the third pull-down driver FD22 may electrically cut off a path between the slave chip pad SDP and the supply terminal of the low voltage VSSIO_EX, thereby preventing a leakage current occurring from the slave chip pad SDP to the supply terminal of the low voltage VSSIO_EX.

The third leakage prevention driver LD22 may be connected between an input terminal of the third control signal PD2 and the supply terminal of the low voltage VSSIO_EX. For example, the third leakage prevention driver LD22 may include an NMOS transistor having a gate terminal receiving the leakage prevention signal PD_C and a source terminal and a drain terminal connected between the input terminal of the third control signal PD2 and the supply terminal of the low voltage VSSIO_EX.

The third leakage prevention driver LD22 may selectively drive the input terminal of the third control signal PD2 with the low voltage VSSIO_EX on the basis of the leakage prevention signal PD_C. For example, the third leakage prevention driver LD22 may be disabled based on the leakage prevention signal PD_C having the logic low level in the power-on mode, and drive the input terminal of the third control signal PD2 with the low voltage VSSIO_EX on the basis of the leakage prevention signal PD_C having the activation level in the power-off mode.

Hereinafter, an operation of the semiconductor device in accordance with a fourth embodiment of the present disclosure, which has the above-described configuration, is described.

First, the operation of the semiconductor device in the power-on mode is described.

The master chip 410 may receive the high voltage VDDIO_EX and the low voltage VSSIO_EX. Each of the high voltage VDDIO_EX and the low voltage VSSIO_EX may be dedicated power that is continuously supplied regardless of whether the slave chip 420 is in the power-on mode or the power-off mode. The master chip 410 may maintain the master chip pad MDP at the first logic level corresponding to the high voltage VDDIO_EX. For example, the first logic level may be a logic high level, i.e., "1", of the predetermined signal generated through the master chip pad MDP.

The slave chip 420 may selectively change the logic level of the slave chip pad SDP to the second logic level corresponding to the low voltage VSSIO_EX, on the basis of a mode signal VDDIO, the first to third control signals PD0, PD1 and PD2 and the tie control signal TIE_L. When the predetermined signal corresponds to the logic low level, the slave chip 420 may drive the slave chip pad SDP with the low voltage VSSIO_EX. Conversely, when the predetermined signal corresponds to the logic high level, the slave chip 420 may not drive the slave chip pad SDP with the low voltage VSSIO_EX. The operation of the slave chip 420 in the power-on mode is described in more detail as follows.

The controller 421 may electrically connect the input terminal of the tie control signal TIE_L to the output terminal of the leakage prevention signal PD_C on the basis of the mode signal VDDIO corresponding to the power-on mode. The controller 421 may electrically disconnect the slave chip pad SDP from the output terminal of the leakage prevention signal PD_C on the basis of the mode signal VDDIO corresponding to the power-on mode. The controller 421 may generate the leakage prevention signal PD_C having a logic low level corresponding to a voltage level of the tie control signal TIE_L.

Each of the first to third leakage prevention drivers LD20, LD21 and LD22 and the dummy leakage prevention driver LD23 may be disabled based on the leakage prevention signal PD_C having the logic low level.

The first to third pull-down drivers FD20, FD21 and FD22 may selectively drive the slave chip pad SDP with the low voltage VSSIO_EX on the basis of the first to third control signals PD0, PD1 and PD2 corresponding to the predetermined signal. When the predetermined signal has the logic low level, at least one of the first to third pull-down drivers FD20, FD21 and FD22 may be enabled based on the first to third control signals PD0, PD1 and PD2, and drive the slave chip pad SDP with the low voltage VSSIO_EX. Conversely, when the predetermined signal has the logic high level, all of the first to third pull-down drivers FD20, FD21 and FD22 may be disabled based on the first to third control signals PD0, PD1 and PD2, and not drive the slave chip pad SDP with the low voltage VSSIO_EX.

The dummy driver FD23 may be disabled based on the tie control signal TIE_L having the logic low level. The dummy driver FD23 may electrically cut off a path between the slave chip pad SDP and the supply terminal of the low voltage VSSIO_EX, thereby having no effect on the slave chip pad SDP.

Next, the operation of the semiconductor device in the power-off mode is described.

The master chip 410 may receive the high voltage VDDIO_EX and the low voltage VSSIO_EX. Each of the high voltage VDDIO_EX and the low voltage VSSIO_EX may be dedicated power that is continuously supplied regardless of whether the slave chip 420 is in the power-on mode or the power-off mode. The master chip 410 may maintain the master chip pad MDP at the first logic level corresponding to the high voltage VDDIO_EX.

The slave chip 420 may forcibly deactivate the first to third control signals PD0, PD1 and PD2 and the tie control signal TIE_L on the basis of the leakage prevention signal PD_C. Each of the first to third control signals PD0, PD1 and PD2 may be unintentionally activated in a floating state in the power-off mode. For example, each of the first to third control signals PD0, PD1 and PD2 may have the activation level according to a change in a voltage level of the master chip pad MDP by a parasitic capacitor formed between the slave chip pad SDP and the input terminal of each of the first to third control signals PD0, PD1 and PD2. In addition, the tie control signal TIE_L may be unintentionally activated in a floating state in the power-off mode. For example, the tie control signal TIE_L may have the activation level according to a change in the voltage level of the master chip pad MDP by a parasitic capacitor formed between the slave chip pad SDP and the input terminal of the tie control signal TIE_L. However, in the power-off mode, the slave chip 420 may forcibly deactivate the first to third control signals PD0, PD1 and PD2 and the tie control signal TIE_L through a leakage prevention operation when the first to third control signals PD0, PD1 and PD2 and the tie control signal TIE_L are unintentionally activated. The operation of the slave chip 420 in the power-off mode is described in more detail as follows.

The controller 421 may electrically connect the slave chip pad SDP to the output terminal of the leakage prevention signal PD_C on the basis of the mode signal VDDIO corresponding to the power-off mode. The controller 421 may electrically disconnect the input terminal of the tie control signal TIE_L from the output terminal of the leakage prevention signal PD_C on the basis of the mode signal VDDIO corresponding to the power-off mode. The controller 421 may generate the leakage prevention signal PD_C having the activation level corresponding to a voltage level of the slave chip pad SDP.

As described above, each of the first to third control signals PD0, PD1 and PD2 may have the activation level according to a change in the voltage level of the master chip pad MDP by the parasitic capacitor formed between the slave chip pad SDP and the input terminal of each of the first to third control signals PD0, PD1 and PD2.

The first to third leakage prevention drivers LD20, LD21 and LD22 may be enabled based on the leakage prevention signal PD_C having the activation level, and drive the input terminals of the first to third control signals PD0, PD1 and PD2 with the low voltage VSSIO_EX, respectively. Accordingly, each of the first to third control signals PD0, PD1 and PD2 may have the deactivation level corresponding to the low voltage VSSIO_EX, and the first to third pull-down drivers FD20, FD21 and FD22 may be disabled based on the first to third control signals PD0, PD1 and PD2 each having the deactivation level. Each of the first to third pull-down drivers FD20, FD21 and FD22 may electrically cut off a path between the slave chip pad SDP and the supply terminal of the low voltage VSSIO_EX, thereby preventing a leakage current occurring from the slave chip pad SDP to the supply terminal of the low voltage VSSIO_EX.

The dummy leakage prevention driver LD23 may be enabled based on the leakage prevention signal PD_C having the activation level, and drive the input terminal of the tie control signal TIE_L with the low voltage VSSIO_EX. Accordingly, the tie control signal TIE_L may have the deactivation level, and the dummy driver FD23 may be disabled based on the tie control signal TIE_L having the deactivation level. The dummy driver FD23 may electrically cut off a path between the slave chip pad SDP and the supply terminal of the low voltage VSSIO_EX, thereby preventing a leakage current occurring from the slave chip pad SDP to the supply terminal of the low voltage VSSIO_EX.

According to embodiments of the present disclosure, even though control signals related to an interface are unintentionally activated in a power-off mode, a leakage current path formed through the interface can be cut off by forcibly deactivating the control signals.

According to embodiments of the present disclosure, a driver included in an interface of a slave chip is controlled not to be turned on in a power-off mode of the slave chip, which makes it possible to prevent a leakage current occurring through the interface in the power-off mode.

While the present disclosure has been illustrated and described with respect to specific embodiments, the disclosed embodiments are provided for the description, and not intended to be restrictive. Further, it is noted that the present disclosure may be achieved in various ways through substitution, change, and modification that fall within the scope of the following claims, as those skilled in the art will recognize in light of the present disclosure. Moreover, the embodiments may be combined to form additional embodiments.

What is claimed is:

1. A semiconductor device comprising:
 a first pad;
 a pull-up resistor connected between the first pad and a supply terminal of a high voltage;
 a second pad connected to the first pad;
 a pull-down driver connected between the second pad and a supply terminal of a low voltage, and suitable for selectively driving the second pad with the low voltage based on a control signal corresponding to a predetermined signal; and
 a first leakage prevention driver connected between an input terminal of the control signal and the supply terminal of the low voltage, and suitable for selectively driving the control signal with the low voltage based on a leakage prevention signal.

2. The semiconductor device of claim 1, further comprising:
- a dummy driver connected between the second pad and the supply terminal of the low voltage, and suitable for selectively driving the second pad with the low voltage based on the leakage prevention signal; and
- a second leakage prevention driver connected between an input terminal of the leakage prevention signal and the supply terminal of the low voltage, and suitable for selectively driving the input terminal of the leakage prevention signal with the low voltage based on the leakage prevention signal.

3. The semiconductor device of claim 1,
wherein the high voltage is supplied through the supply terminal of the high voltage regardless of whether a current power mode is a power-on mode or a power-off mode, and
wherein the low voltage is supplied through the supply terminal of the low voltage regardless of whether the current power mode is the power-on mode or the power-off mode.

4. A semiconductor device comprising:
a first pad;
a pull-up resistor connected between the first pad and a supply terminal of a high voltage;
a second pad connected to the first pad;
a pull-down driver connected between the second pad and a supply terminal of a low voltage, and suitable for selectively driving the second pad with the low voltage based on a control signal corresponding to a predetermined signal;
a first leakage prevention driver connected between an input terminal of the control signal and the supply terminal of the low voltage, and suitable for selectively driving the control signal with the low voltage based on a leakage prevention signal; and
a controller connected to the second pad, and suitable for generating the leakage prevention signal based on a mode signal and a tie control signal.

5. The semiconductor device of claim 4, wherein the controller includes:
- a first connector connected between the second pad and an output terminal of the leakage prevention signal, and suitable for connecting the second pad to the output terminal of the leakage prevention signal in a power-off mode based on the mode signal; and
- a second connector connected between an input terminal of the tie control signal and the output terminal of the leakage prevention signal, and suitable for connecting the input terminal of the tie control signal to the output terminal of the leakage prevention signal in a power-on mode based on the mode signal.

6. The semiconductor device of claim 4, further comprising:
- a dummy driver connected between the second pad and the supply terminal of the low voltage, and suitable for selectively driving the second pad with the low voltage based on the leakage prevention signal; and
- a second leakage prevention driver connected between an input terminal of the tie control signal and the supply terminal of the low voltage, and suitable for selectively driving the input terminal of the tie control signal with the low voltage based on the leakage prevention signal.

7. The semiconductor device of claim 4,
wherein the high voltage is supplied through the supply terminal of the high voltage regardless of whether a current power mode is a power-on mode or a power-off mode, and
wherein the low voltage is supplied through the supply terminal of the low voltage regardless of whether the current power mode is the power-on mode or the power-off mode.

* * * * *